(12) United States Patent
Wu

(10) Patent No.: US 10,727,393 B1
(45) Date of Patent: Jul. 28, 2020

(54) STACK ACTUATORS ARRAY AND DEFORMABLE MIRRORS BY UTILIZING WAFER DICING, CONDUCTOR REFILLING, AND HYBRID INTEGRATING AND ASSEMBLY TECHNIQUES

(71) Applicant: Xingtao Wu, Woburn, MA (US)

(72) Inventor: Xingtao Wu, Woburn, MA (US)

( * ) Notice: Subject to any disclaimer, the term of this patent is extended or adjusted under 35 U.S.C. 154(b) by 0 days.

(21) Appl. No.: 15/829,961

(22) Filed: Dec. 3, 2017

(51) Int. Cl.
| | |
|---|---|
| *G02B 26/00* | (2006.01) |
| *H01L 41/083* | (2006.01) |
| *H01L 41/04* | (2006.01) |
| *H01L 41/047* | (2006.01) |
| *H01L 41/09* | (2006.01) |
| *H01L 41/187* | (2006.01) |
| *H01L 41/297* | (2013.01) |
| *H01L 41/338* | (2013.01) |
| *H01L 41/25* | (2013.01) |
| *G02B 26/08* | (2006.01) |
| *H01L 41/277* | (2013.01) |
| *H01L 41/47* | (2013.01) |

(52) U.S. Cl.
CPC ...... *H01L 41/0838* (2013.01); *G02B 26/0825* (2013.01); *H01L 41/042* (2013.01); *H01L 41/0471* (2013.01); *H01L 41/0913* (2013.01); *H01L 41/1876* (2013.01); *H01L 41/25* (2013.01); *H01L 41/277* (2013.01); *H01L 41/297* (2013.01); *H01L 41/338* (2013.01); *H01L 41/47* (2013.01)

(58) Field of Classification Search
CPC ............ G02B 26/0825; H01L 41/0838; H01L 41/042; H01L 41/0471; H01L 41/0913; H01L 41/1876; H01L 41/25; H01L 41/277; H01L 41/297; H01L 41/338; H01L 41/47
USPC ......... 359/198.1, 199.4, 200.8, 201.2, 212.1, 359/217.2, 221.2, 223.1, 224.1, 224.2, 359/230, 231, 290, 291, 298
See application file for complete search history.

(56) References Cited

U.S. PATENT DOCUMENTS

2010/0202070 A1\* 8/2010 Hutchin ............. G02B 26/0825
359/849

\* cited by examiner

*Primary Examiner* — William Choi
(74) *Attorney, Agent, or Firm* — Xingtao Wu

(57) ABSTRACT

A method of fabricating pre-structured functional wafers, pre-structured functional cuboid or wafer stack, and a method of fabricating an array of functional multilayer stack actuators made of relaxor ferroelectric single crystal piezoelectric thin layers comprising sequentially repeated steps of wafer dicing and trench refilling into relatively thick wafer(s). A bulk-micromachined dimensioned deformable mirror device comprising a base supporting substrate, a plurality of stack actuators that is made by segmenting a pre-structured relaxor ferroelectric single crystal piezoelectric cuboid or wafer stack, a plurality of pedestals disposed on the plurality of stack actuators; a deformable membrane mirror mounted on said pedestals; and a plurality of addressable electrode contacts.

24 Claims, 25 Drawing Sheets

STACK ACTUATORS ARRAY AND DEFORMABLE MIRRORS BY UTILIZING WAFER DICING, CONDUCTOR REFILLING, AND HYBRID INTEGRATING AND ASSEMBLY TECHNIQUES

FIELD OF THE INVENTION

The present invention relates to the manufacturing of piezoelectric stack actuators and deformable mirror devices in an arrayed format. More specifically, it relates to a method of batch fabricating single crystal piezoelectric stacks with embedded electrodes, an array of stack actuators, and deformable mirror devices by sequential dicing, refilling, and integrating and assembly techniques with significantly improved efficiency, high yield, and reduced cost.

BACKGROUND OF THE INVENTION

Piezoelectric materials, especially piezoelectric ceramics such as PZT (Lead Zirconate Titanate) are the most widely known materials used for the manufacturing of stacked actuators and transducers among all ferroelectric-type materials. Recently, however, other materials have begun to be developed for use as stack actuators, which exhibit many beneficial properties not available in traditional piezoelectric materials. One type of these materials is the relaxor ferroelectric single crystals such as piezoelectric lead manganese niobate lead titanate (PMN-PT) and lead zinc niobate-lead titanate (PZN-PT). These relaxor ferroelectric single crystal materials lead to a new generation of piezoelectric materials possessing prominent properties and are poised to advance piezoelectric applications. The attractiveness of these materials lies in the fact that their piezoelectric coefficients ($d_{33}$>1500 pC/N, $d_{31}$: 900~1100), electromechanical coupling factor and strain levels (0.5%~1.2%) are significantly higher than those of conventional lead zirconate titanate (PZT) materials. Unlike piezoceramic and sol-gel film piezoactuators that employ strain magnification schemes, single crystal actuators can deliver higher strain levels without sacrificing generative force. Further, the low strain hysteresis and the stability of single crystals result in improved controllability for piezoactuators.

Such single crystal piezoelectric materials are typically manufactured by crystal growth technique and its ingot is then sliced into wafers with a thickness usually thicker than two hundred microns. However, in order to use the high performance single crystal piezoelectric material in producing its layered stack actuators, there are a few major technical barriers to overcome. Firstly, it is difficult to make bulk single crystal piezoelectric sheets with a thickness less than one hundred microns with no physical cracks, and as a result, the thickness of the single crystal piezoelectric sheets used in stacked actuators are usually from several hundred microns to several millimeters. Secondly, bonding of multiple layers of such wafers in order to achieve a multi-layer stacked wafer is technical challenging since the material becomes extremely fragile within such thickness range, and as a results, the stacked actuators made of such single crystal piezoelectric materials are usually offered with relatively thicker thickness for each of its layers and the overall size of a stack transducer is typically large. Thirdly, in order to manufacturing stacked actuator in an arrayed production manner, there is a stringent need to make electrical connections from segmented actuators' sidewalls since the overall stack thickness becomes extremely challenging to achieve full coverage of deposited metal material(s), and this is especially true when tens to hundreds of piezoelectric layers are stacked. Lastly, the technical requirement becomes even more stringent if an array of stack micro actuators is being manufactured wherein the actuator density per unit area is significantly higher than that of macro-sized stack actuators. As a result, the manufacturing of single crystal stack actuators, which are used for actuating deformable mirrors for correction of wavefront aberrations for adaptive optics, are highly limited in achieving high performance with regards to a plurality of key parameters including, but not limited to sizes, array densities, strokes, actuation voltage requirement, manner of implementing associated driver electronics, and the overall device weight and cost.

In addition to relaxor ferroelectric single crystal wafers, other piezoelectric and/or electrostrictive materials such as traditional PZT ceramics, PZT single crystals, PMN ceramics, etc. are facing the same challenging in manufacturing stack actuators in order to drive motions of a deformable mirror when they are offered as bulk wafers with relatively thicker thickness, thus calling for a solution that is applicable to all above-mentioned wafer materials.

SUMMARY OF THE INVENTION

It is therefore an object of this invention to provide an improved method of fabricating a relaxor ferroelectric single crystal piezoelectric stack actuator without necessarily committing to bonding multiple thin wafers.

It is a further object of this invention to provide an improved method of fabricating a stack comprising of multiple of such single crystal piezoelectric thin layers without using wafers with thin thickness but instead directly forming multiple thinner layers in a relatively thicker wafer.

It is a further object of this invention to provide a method of producing a pre-structured wafer with embedded multiple of single crystal piezoelectric thin layers and with embedded electrodes.

It is a further object of this invention to provide a pre-structured cuboid by hybrid integrating and/or assembly of multiple of the pre-structured wafers.

It is a further object of this invention to provide an array of stack actuator by segmenting a pre-structured wafer and/or a pre-structured cuboid.

It is a further object of this invention to provide such a stack actuator array with each of its units having interconnected electrodes.

It is a further object of this invention to provide such a stack actuator array in integration with ASIC-based driver electronics.

It is a further object of this invention to provide such a stack actuator array in integration further with a deformable mirror device.

DETAILED DESCRIPTION OF THE INVENTION

To provide an overall understanding of the invention, certain illustrative embodiments and fabrication methods will now be described including manufacturing of pre-structured relaxor ferroelectric single crystal wafers with embedded multilayer structures, manufacturing of pre-structured relaxor ferroelectric single crystal cuboids by assembling multiple pre-structured wafers, methods for fabricating an array of stack actuators and/or stack micro actuators, and methods for creating different types of deformable mirror devices. It will be understood by one of ordinary skill in the art that the pre-structured wafers, pre-structured cuboids, arrays of stack actuators, and method of building deformable mirror devices described herein may be adapted and modified as is appropriate for the application being addressed and that the devices and methods described herein may be employed in other suitable applications, and that such other additions and modifications will not depart from the scope hereof.

As delineated in the Background section above, traditional piezoelectric materials such as PZT and co-firing PMN ceramics have a few restriction for high performance actuator and transducer applications. The sol-gel technique used for forming the thick PZT film, or the co-firing process used forming PMN film, are complicated in that many steps are required to achieve multi-level stacks. Also, due to the polycrystalline phase of the piezoelectric thin-film, the electro-mechanical performances of the actuator are not satisfactory. Besides, the high post-annealing temperature ($>500°$ C.) of the thin-film process prohibits direct manufacturing of the patterned actuator structures onto a CMOS drive substrate. On the other hand, making stack transducers by bonding multiple wafers is labor intensive, typically only produce relatively large stacks, and is not suitable for batch fabricating an array of such stacks due to the challenges in making electrode interconnection onto the sidewalls of the arrayed stacks.

Figure 1A:
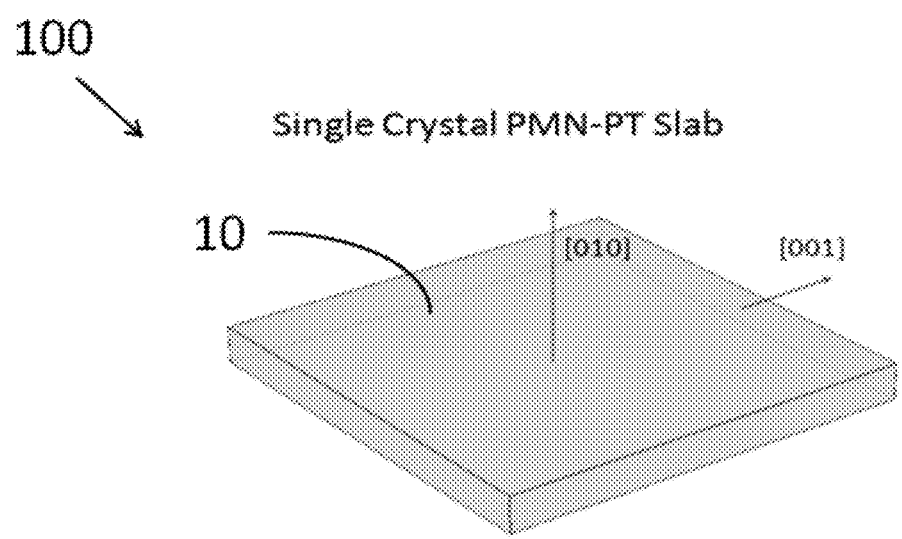
FIG. 1A is a simplified view of a relatively thick wafer made of relaxor ferroelectric single crystal material, onto which bulk micromachining process by wafer dicing is to be used to form trenches.

Referring now to FIG. 1A, a simplified schematics view 100 of a relatively thick wafer 10 is made of relaxor ferroelectric single crystal material, into which bulk micromachining process by wafer dicing is to be used to form trenches according to an illustrative embodiment of the present invention. Typically, the wafer is originally sliced from a crystal ingot obtained by crystal growth method. Wafers are commercially available in today's market. Similar to single crystal active material such as PMN-PT, PIN-PMN-PT, PZN-PT, etc., other active or smart materials can also be utilized as the starting wafer slab to work with including thick wafers of PZT crystals, PZT ceramics, PMN ceramics, magnetostrictrive ceramics, and shape-memory materials, to name a few. Thick wafers herein refer to the thicknesses that are typically available in commercial market, ranging from millimeters down to tens of microns or even less. Typically thickness that is easy to work is more or less one millimeter range. The shape of the wafer are usually square, rectangular, and round, but the manufacturing method according to the present invention to achieve stacks is applicable to irregular shaped wafer as well. Typical wafer sizes are from a few inches to millimeters ranges, but larger wafer sizes are not excluded as long as they can be acquired from commercial sources from industry supply chain. In FIG. 1A, the wafer for the illustration purpose is typically cut form ingot with [001] orientation, thus for this square-shaped wafer, the "d33" mode operation in terms of piezoelectrics is applicable to the three orthogonal directions. All other single crystal wafers orientations other than those shown in FIG. 1A can be used as the starting wafer here in accordance with the present invention. All other bulk wafers other than piezoelectric ones such as electrostrictive wafers do not departing from the present invention in order to use the invention to manufacture the stack especially in a batch fabrication manner.

Figure 1B:
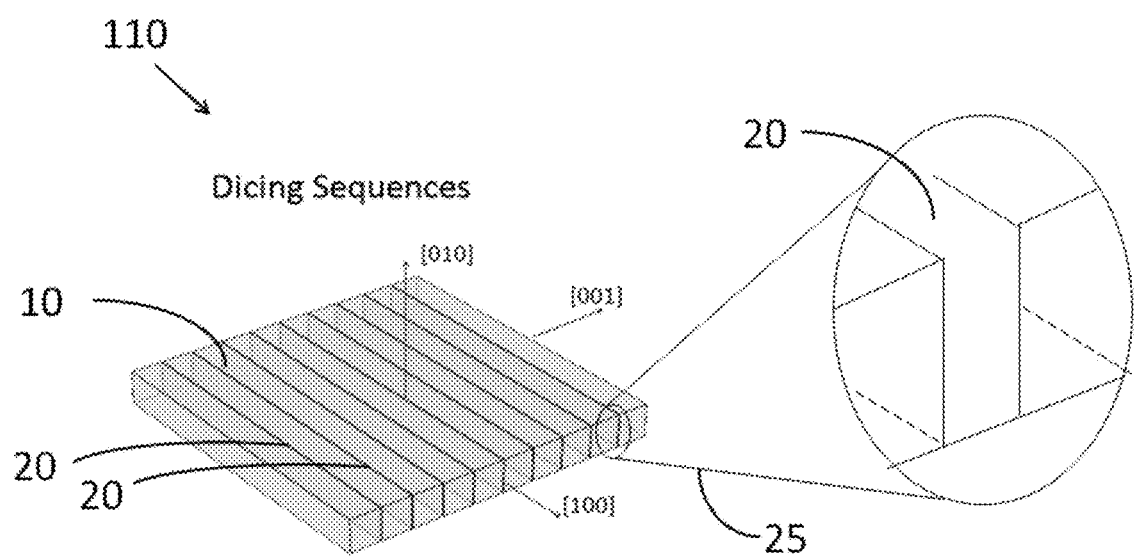
FIG. 1B is a simplified view of the FIG. 1A wafer onto which trenches are formed by dicing.

Referring now to FIG. 1B, a simplified view of the FIG. 1A wafer onto which a plurality of micro trenches 20 have been formed by wafer dicing. Although preferred by wafer dicing, where a blade mechanically cut into the wafer to forms trenches, other mechanical cutting techniques, water jet, ultrasonic assisted dicing, ultrasound assisted etching, laser machining or micromachining, and etching techniques, including wet etching and deep reactive ion etching, can be used to form trenches into the wafer 10. The process forms a plurality of trenches or cavities 20. The distribution of the trenches is typically in parallel with each other, but other trenches distributions can be assigned to form labyrinths depending on actuator designs in terms of size, shape, array format, and application requirements of the stacks. The cutting depth could be either through the full wafer thickness or partially cut through depending on application designs. Particularly, a micromachined trench can have a width from as large as a few hundreds of microns down to as narrow as sub-microns ranges. Tradeoff should be made to determine the trench depth with regards to the trench width. Higher aspect ratio trenches are usually more challenging to make.

According to the present invention, and departing from prior arts using direct depositing and/or cofiring multiple layers of traditional PZT and other piezoelectric ceramics material(s), the single crystal piezoelectric stack and the array of which, are formed by carrying on a series of dicing and conductor refilling steps into a relatively thick wafer slab. The root reason for this manufacturing approach lies in the fact that the relaxor ferroelectric single crystal piezoelectric material is usually produced by crystal growth methods, and as a result, is being commercially offered by the wafer industry as wafers that are usually thicker than one hundred microns.

Even though direct bonding of such freestanding thicker wafers are technical feasible, a thicker layer of piezoelectric layer requires a higher voltage to actuate in order to achieve its maximum strain. In addition, once the overall thickness of the stacked wafers become substantially thick, it becomes problematic to make electrical interconnection on the diced trench sidewalls without any failure. Thus, the present invention aims to deal with stack manufacturing by not committing to wafer bonding. As the relaxor ferroelectric single crystal is observed to be extremely fragile at this thickness or less, it becomes beneficial to produce the relaxor ferroelectric single crystal stacked structures by working on relatively thicker wafer. In other words, by working on the thick wafer, multiple thinner layers of an active or smart material can be obtained in a stacked manner, each layer preferably with a much thinner thickness than the wafer thickness.

Figure 1C:
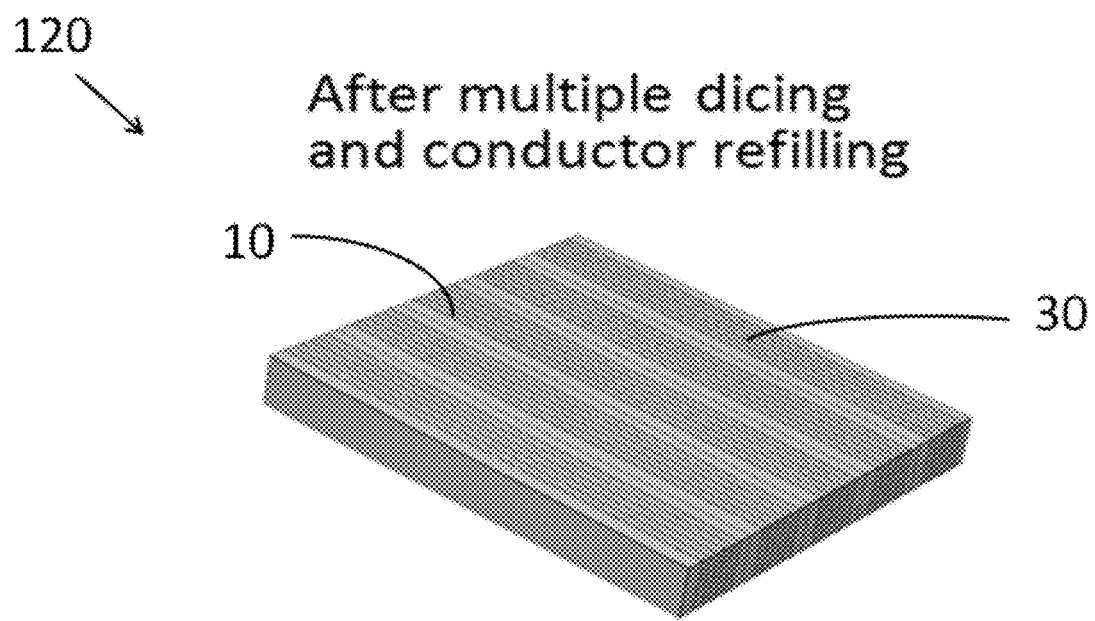
FIG. 1C is a simplified view of the FIG. 1A wafer into which more micro trenches are formed by dicing either from the top side of the wafer slab or from the opposite side.

Refer now to FIG. 1C, a simplified view 120 of the FIG. 1A wafer onto which more micro trenches 30 are formed by dicing either from the top side of the wafer slab or from the opposite side. As can be seen in FIG. 1C, the trench density is not necessarily uniform across the wafer surface. In a specific application, part of the wafer material can be excluded from forming trenches in order to keep space to ease engineering handling of individual stack actuator devices.

Figure 1D:
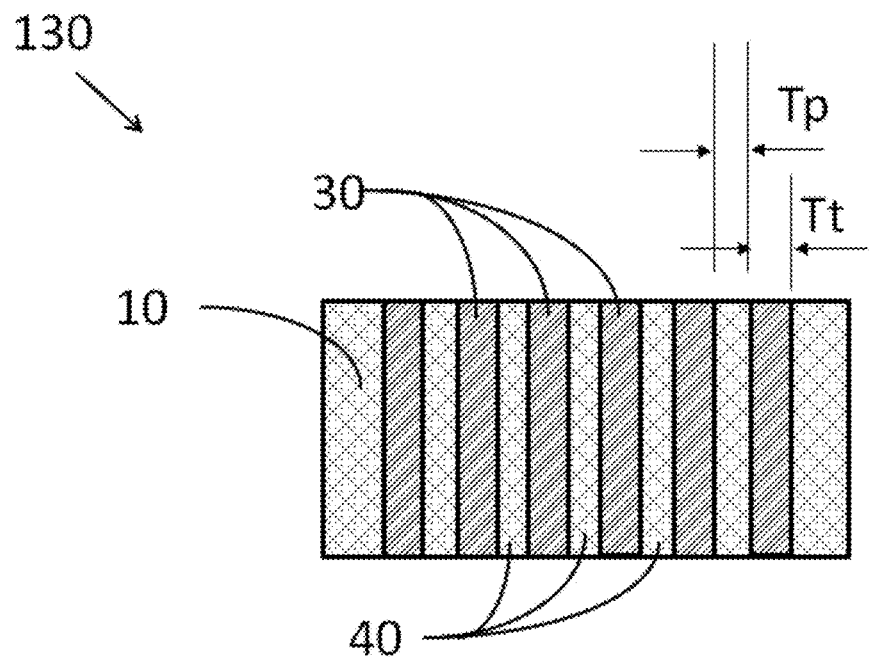
FIG. 1D is a magnified cross-sectional view of a portion of the FIG. 1C wafer upon completion of full-depth dicing and refilling sequences in accordance with the present invention, into which is structured with embedded internal conductors (electrodes) alternatively separating the original wafer into multiple thin layers, thus forming a multilayer stack.

FIG. 1D further illustrates a magnified cross-sectional view 130 of a portion of the FIG. 1C wafer slab 10 upon completion of dicing and refilling sequences in accordance with the present invention, on which the single crystal wafer 10 is structured with embedded internal conductors (electrodes) 30 alternatively separating the original wafer slab into multiple thin layers 40, thus forming a multilayer stack. The diced trench is then refilled with conductive material, thus forming the electrodes. The trench width Tt, as shown in FIG. 1D, is previously determined by thickness of the dicing blade. The thickness Tp of the single crystal piezoelectric layer is governed by how close the two adjacent dicing trenches are spacing. Typical layer thickness has been obtained experimentally to 200 microns, 150 microns, 100 micron, and 50 microns, etc. Thinner thicknesses can be obtained by controlling the spacing of the two diced trenches, thus in principle no lower limit. However, in real practice, a typical thickness range is ten microns, several tens, and to a few hundred of microns.

The trench width Tt determines the thickness of the electrode. The refilling material for the electrode 30 is preferred to be silver epoxy as it is cost effective. Gold epoxy is a more expensive option but offers better electrical performance. Ni-based epoxy offers higher hardness. Not limiting to epoxy-based refiller, other refilling materials are technically feasibly as along as the trenches are physically filled and meanwhile metal contacts are being built onto the trench sidewalls. This means that the metal contact can be achieved by deposit a thin film of metal or alloy onto trench sidewalls followed by refilling the rest empty space of the trenches with either non-conductive or conductive epoxy. Metal contact deposition methods well-known to industry include evaporation, sputtering, dip coating, etc. The electrode refilling can also be fulfilled by refilling the trenches with solder paste, alloy powers such as Iridium and Indium alloys, etc., followed by a heating reflow cycle. Cautions should be always taken to ensure the inner surfaces of the trench are clean and free of dicing debris or particles in order to achieve good adhesion. Experimentally, it is found that certain surface treatments such as ultrasound-assisted HCl wet etching, ion beam etch back, plasma treatment, and ultrasound cleaning, if with proper recipe, could be useful to obtain high quality surface in order to ensure strong adhesion and good metal contact.

Figure 1E:
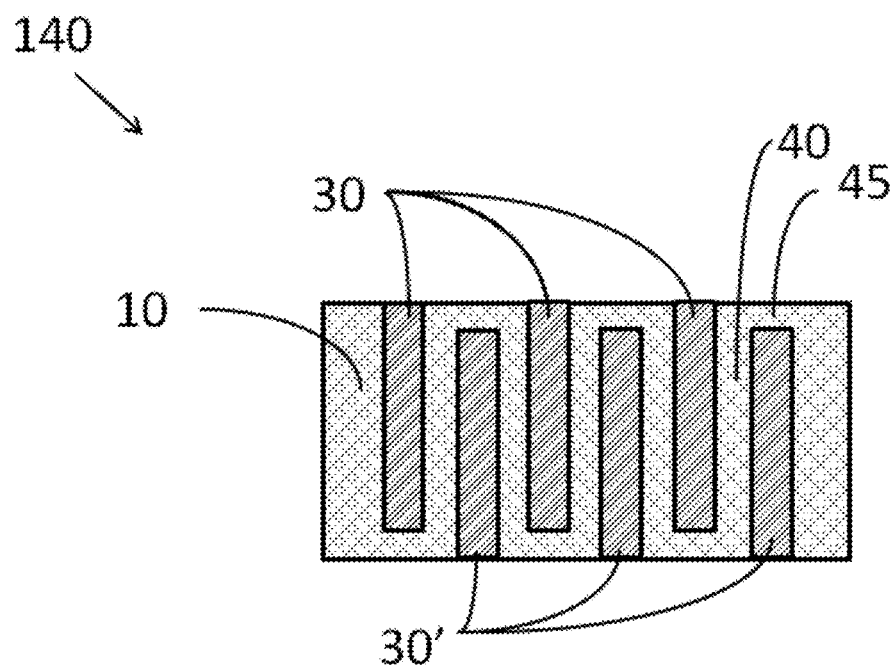
FIG. 1E is a magnified cross-sectional view of a portion of the FIG. 1C wafer upon completion of partial-depth dicing and refilling sequences in accordance with the present invention, into which is structured with embedded internal conductors (electrodes) alternatively separating the original wafer into multiple thin layers, thus forming a multilayer stack.

Referring now to FIG. 1E, a magnified cross-sectional view 140 of a portion of the FIG. 1C wafer 10 upon completion of dicing and refilling sequences in accordance with the present invention, into which is structured with embedded internal conductors (electrodes) alternatively separating the original wafer into multiple thin layers, thus forming a multilayer stack. Different from FIG. 1D trenches, another preferred trenches in FIG. 1E are formed by partially cutting the wafer 10's thickness, thus a portion 45 of the original wafer material remains intact on the stack structure 140, and therefore, there presents in FIG. 1E a plurality of refilled trenches—electrodes 30' on the opposite side, which is obtained from the bottom surface of the wafer slab 10. Note that full-depth dicing and partial-depth cutting can be used in a combined manner either from one surface or from both surface of the wafer 10.

Figure 2A:
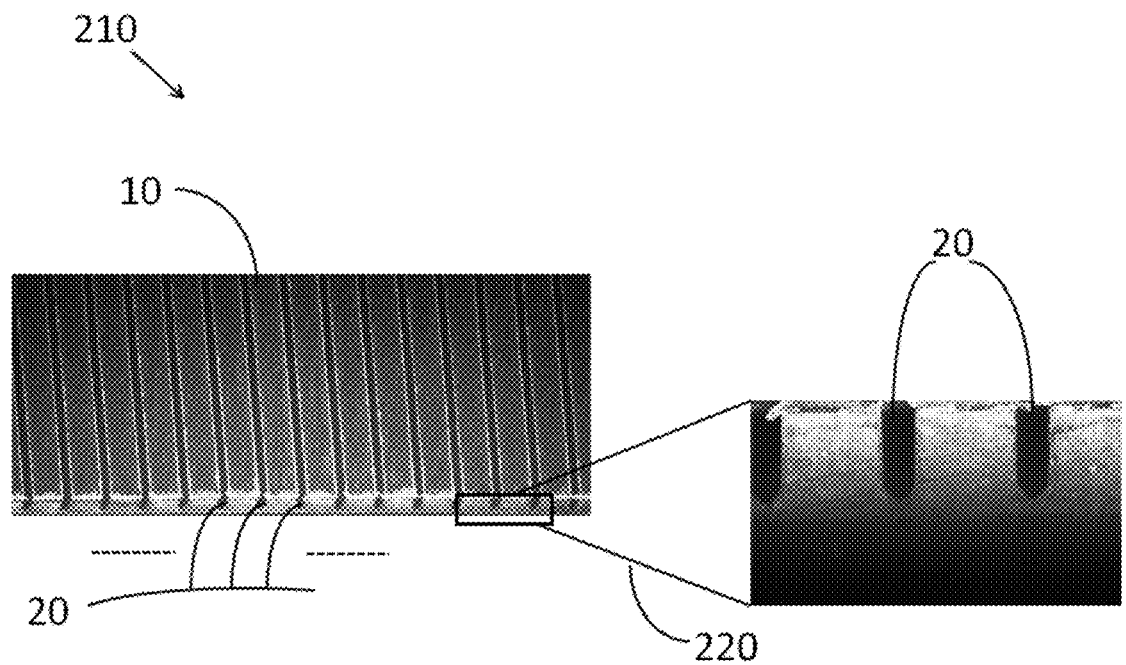
FIG. 2A is a photo of a portion of a wafer that has been diced with a plurality of micro trenches.
Figure 2B:
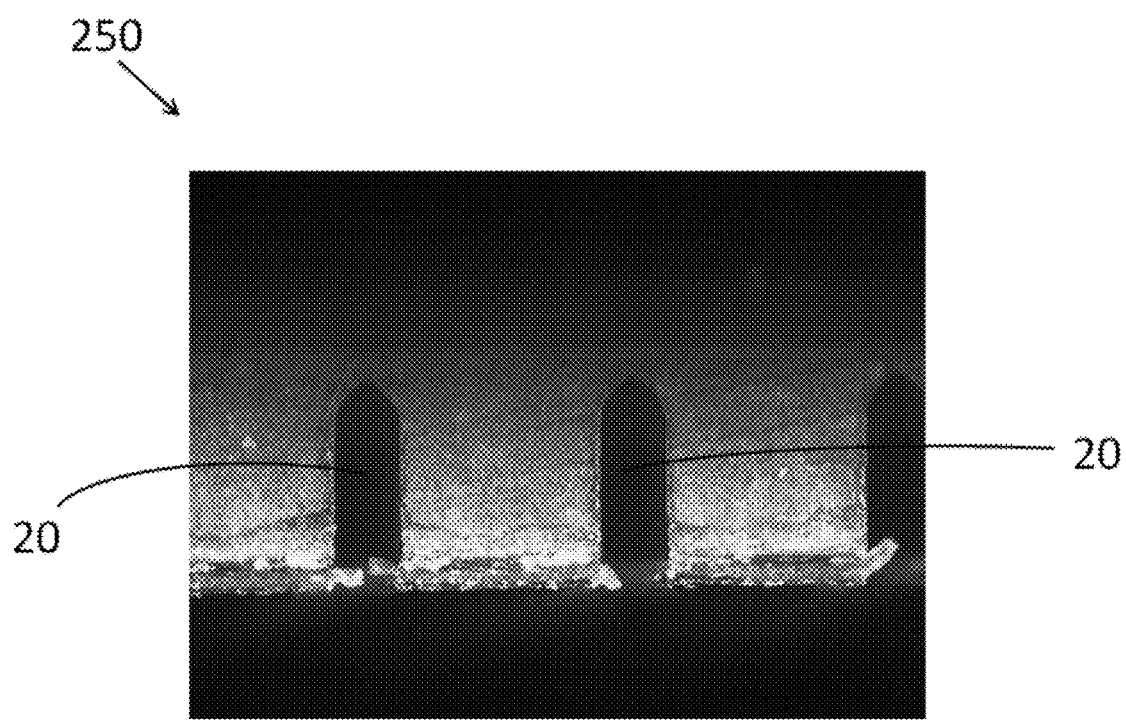
FIG. 2B is a photo taken under microscope showing the magnified cross-sectional shapes of the micro trenches that have been formed on the wafer of FIG. 2A.

Referring now to FIG. 2A, a photo 210 of a portion of the wafer 10 that has been experimentally diced with a plurality of micro trenches 20 in accordance with the present invention. A magnified view of a portion of 210 is further shown as 220 where the width of the two trenches 20 is approximately 200 microns and with a depth of ~550 microns. FIG. 2B present a more closed-up photo 250 of the micro trenches 20 in FIG. 2A that is taken under microscope, indicating the cross-sectional shapes of the micro trenches that have been formed into the wafer slab 10. The cross-sectional shapes of the trenches are determined by the type of dicing blade. Thus, the trench bottom can be selected to be a flat surface, a domed curve, or an angled slope depending on edge type of the blade in use. These may be usable to refine the electro-mechanical performance of the functional thin layers of an entire stack.

Figure 2C:
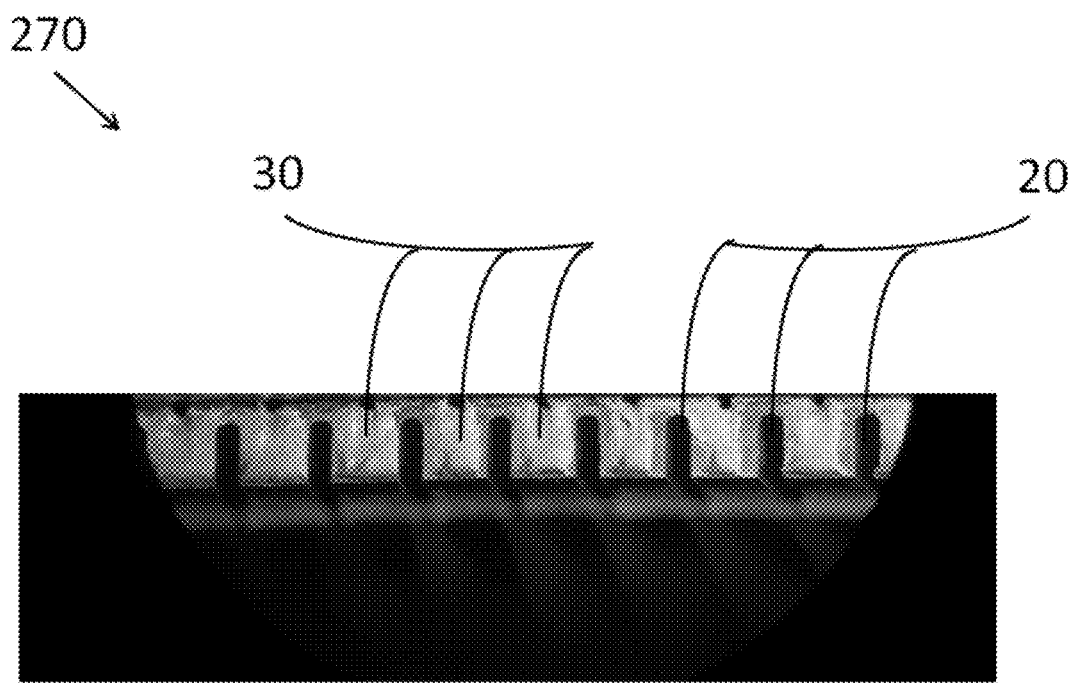
FIG. 2C is a photo taken under microscope showing the cross-sectional view of unfilled trenches on one side of the wafer while on the opposite side of the wafer the trenches have been refilled with conductive electrode.

FIG. 2C further presents a photo 270 taken under microscope showing the cross-sectional view of unfilled trenches 20 on one side of the wafer (bottom side) while on the opposite side of the wafer (top side) are trenches that have been refilled with conductive electrode 30. The unfilled trenches 20 will be refilled with electrodes to fulfil a solid stack.

Figure 3A:
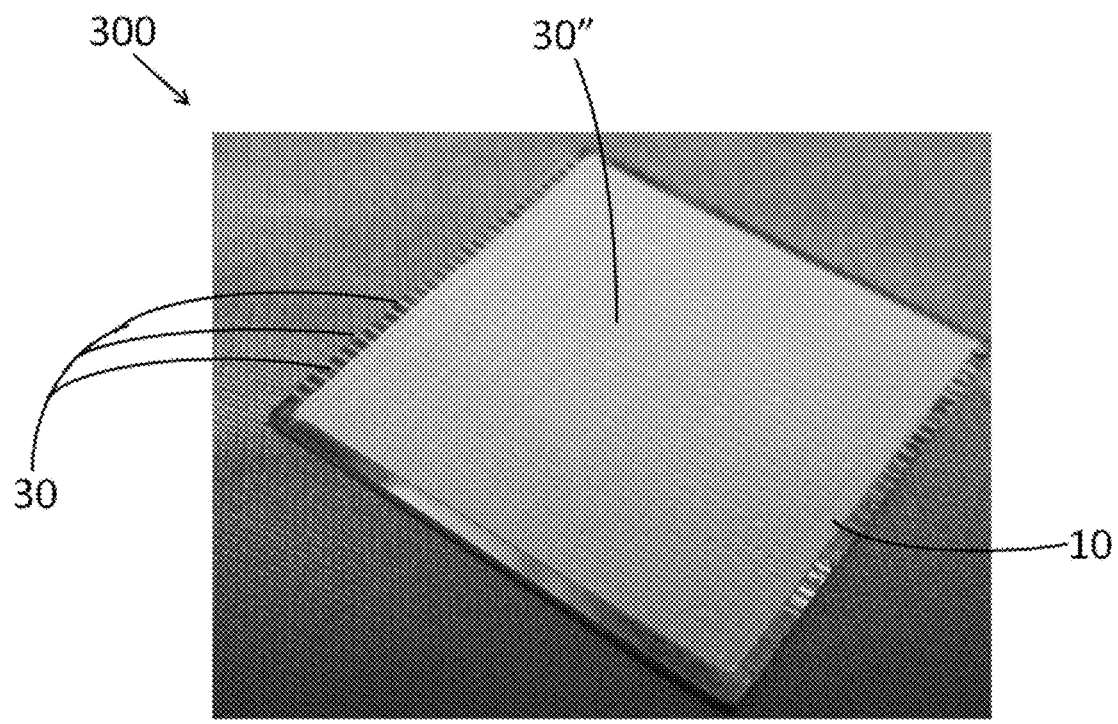
FIG. 3A illustrates a photo of a pre-structured single crystal PMN-PT wafer that has been processed with embedded multiple layers of PMN-PT, with alternatively arranged internal electrodes, and together with external electrodes that interconnect internal electrodes on each opposite side of the wafer.

FIG. 3A illustrates a photo 300 of a thick single crystal PMN-PT wafer 10 that has been completed by refilling trenches from both sides. With embedded electrodes 30, alternatively separating PMN-PT thin layers, the wafer is now has been structured with stacks comprising of multi-layer of PMN-PT single crystal material, ready to be segmented by either dicing into smaller wafers or multiple of stacks according to the present invention. A common electrode 30" is formed onto the wafer top surface, serving as the external interconnection for all internal electrodes that have exposures on the top surface. Similarly, another common electrode (not shown in the figure) has been formed on the opposite surface of the wafer 10 that builds interconnection to the plurality of interdigitated electrodes on this opposite surface.

Figure 3B:
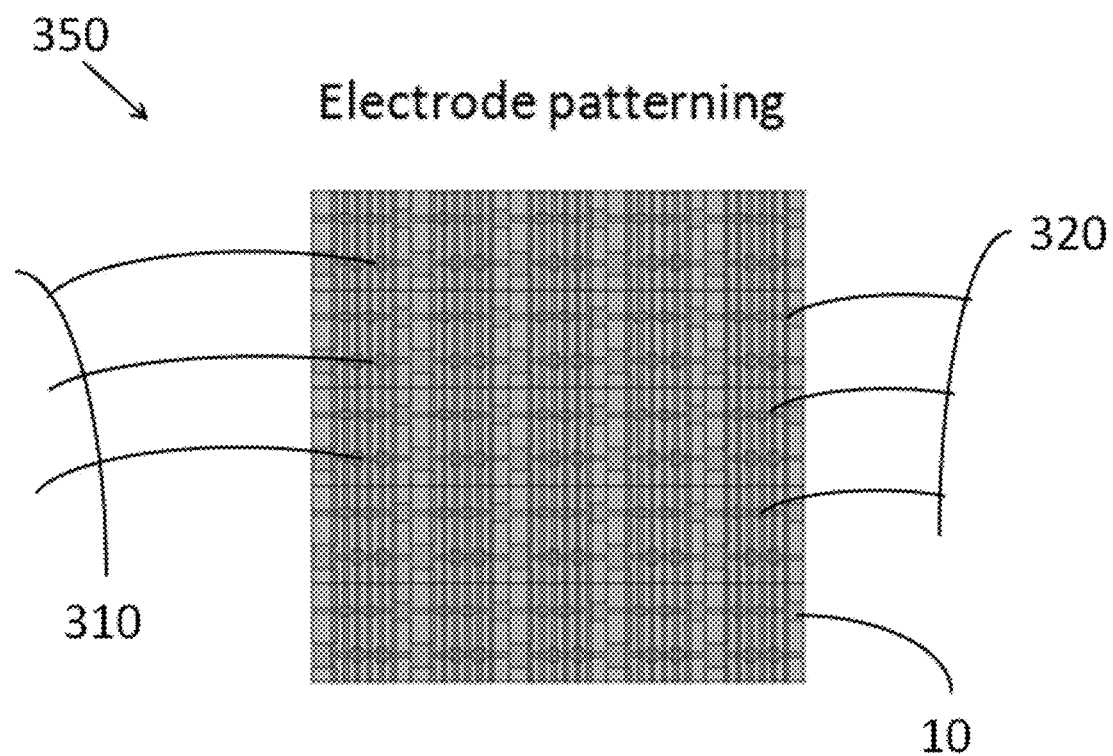
FIG. 3B illustrates a simplified view of a pre-structured thick single crystal PMN-PT wafer surface that has been processed with embedded multiple layers of PMN-PT, with alternatively arranged internal electrodes, and together with deposited electrode patterns.

However, the external electrode as shown in FIG. 3A does not necessarily a continuous object. Not departing from the present invention, FIG. 3B illustrates a simplified view 350 of a thick single crystal PMN-PT wafer surface that have been processed with embedded multiple layers of PMN-PT, with alternatively arranged internal electrodes, and together with deposited electrode patterns. In FIG. 3B, the two groups of external electrodes 310 and 320, respectively, are formed onto a single side of the wafer slab 10, which make it easier if an application that prefers to access electrodes from a single side.

Figure 3C:
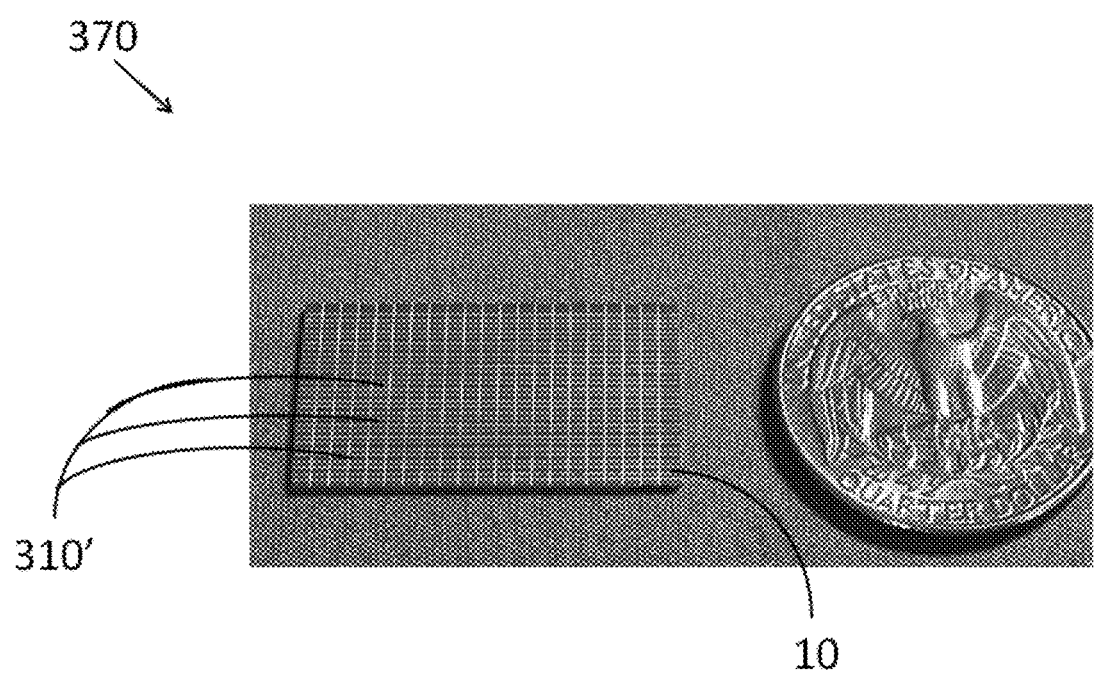
FIG. 3C illustrates a photo of a pre-structured thick single crystal PMN-PT wafer, with a rectangular shape, that has been processed with embedded multiple layers of PMN-PT with alternatively arranged electrodes.

FIG. 3C illustrates a photo 370 of a thick single crystal PMN-PT wafer 10, with a rectangular shape, that have been processed with embedded multilayer PMN-PT stacks with alternatively arranged internal electrodes. The vertical metal lines 310' serve as external electrode patterns to connect internal electrodes (horizontal ones in the figure).

Figure 4A:
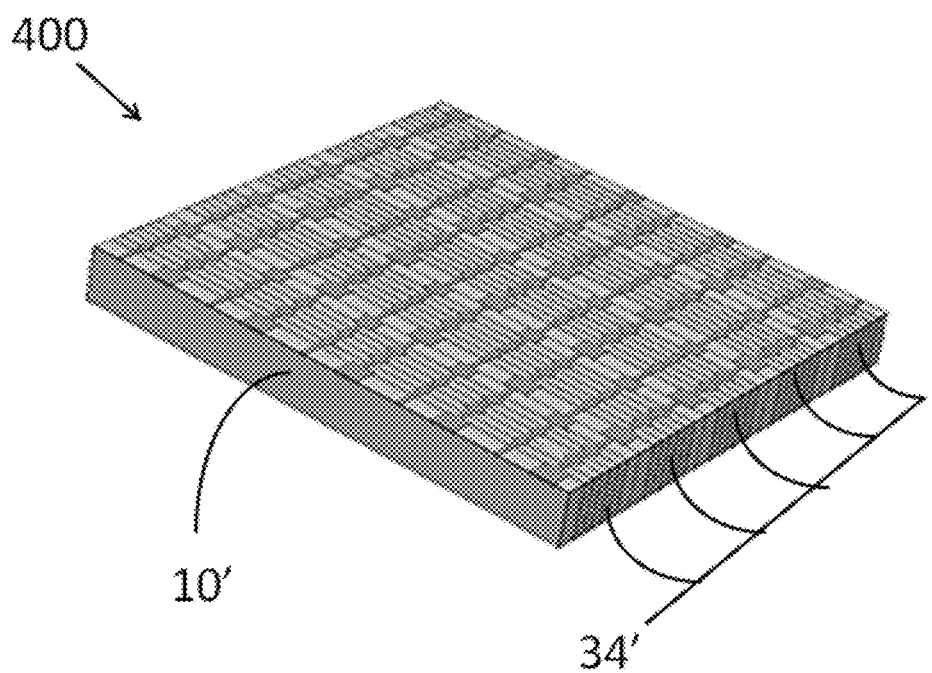
FIG. 4A illustrates a 3-dimensional view of a pre-structured single crystal PMN-PT wafer that has been processed with embedded multilayer PMN-PT stacks together with interdigitated electrodes.

Referring now to FIG. 4A, a 3-dimensional view 400 of a pre-structured single crystal PMN-PT wafer 10' that has been processed with embedded multilayer PMN-PT stack actuators 34'. The pre-structured wafer 10' is to be used as the building block to produce a pre-structured single crystal PMN-PT cuboid.

Figure 4B:
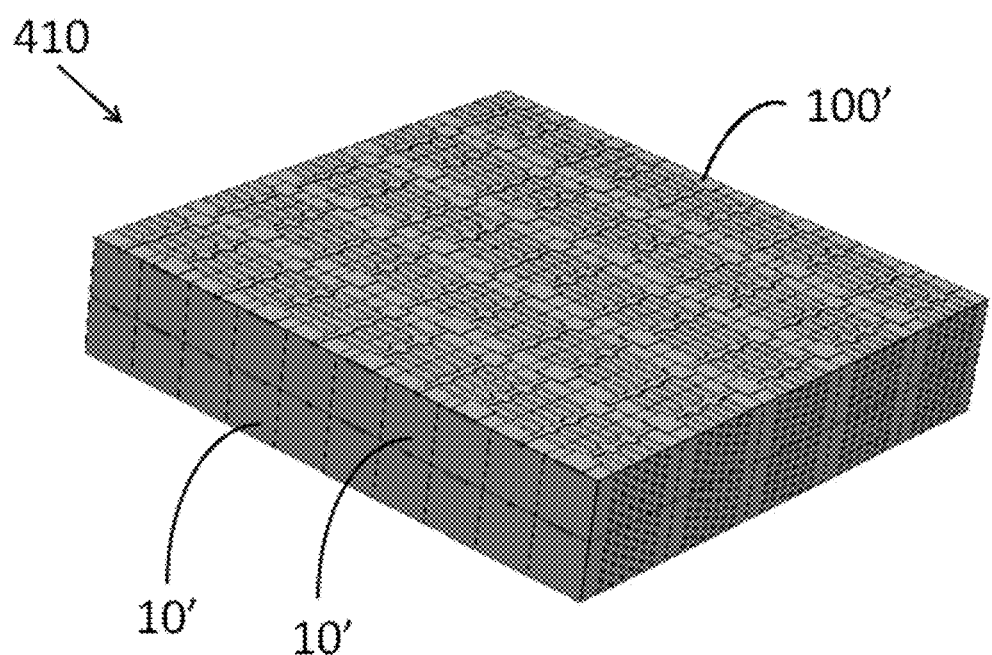
FIG. 4B illustrates a 3-dimensional view of a pre-structured single crystal PMN-PT cuboid comprising of two of the pre-structured PMN-PT wafers of FIG. 4A.
Figure 4C:
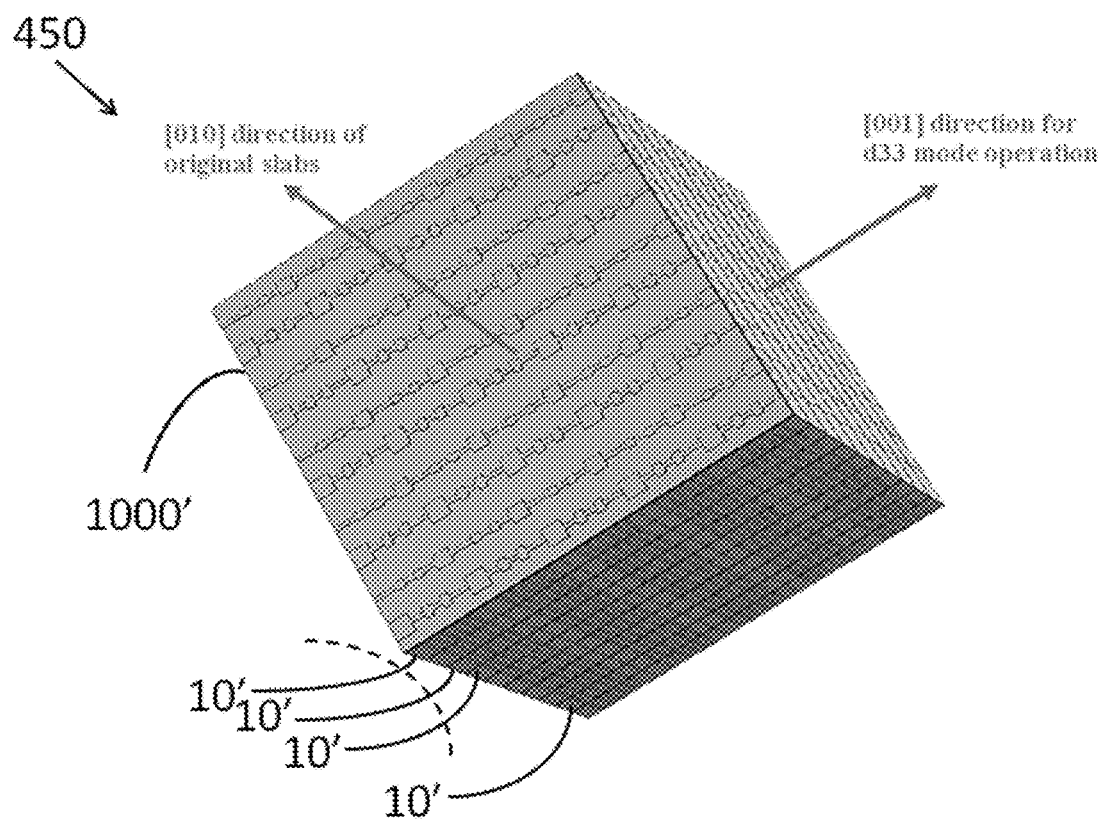
FIG. 4C illustrates a 3-dimensional view of a pre-structured single crystal PMN-PT cube comprising of a plurality of pre-structured PMN-PT wafers of FIG. 4A being integrated and/or assembled together in accordance with the present invention.
Figure 4D:
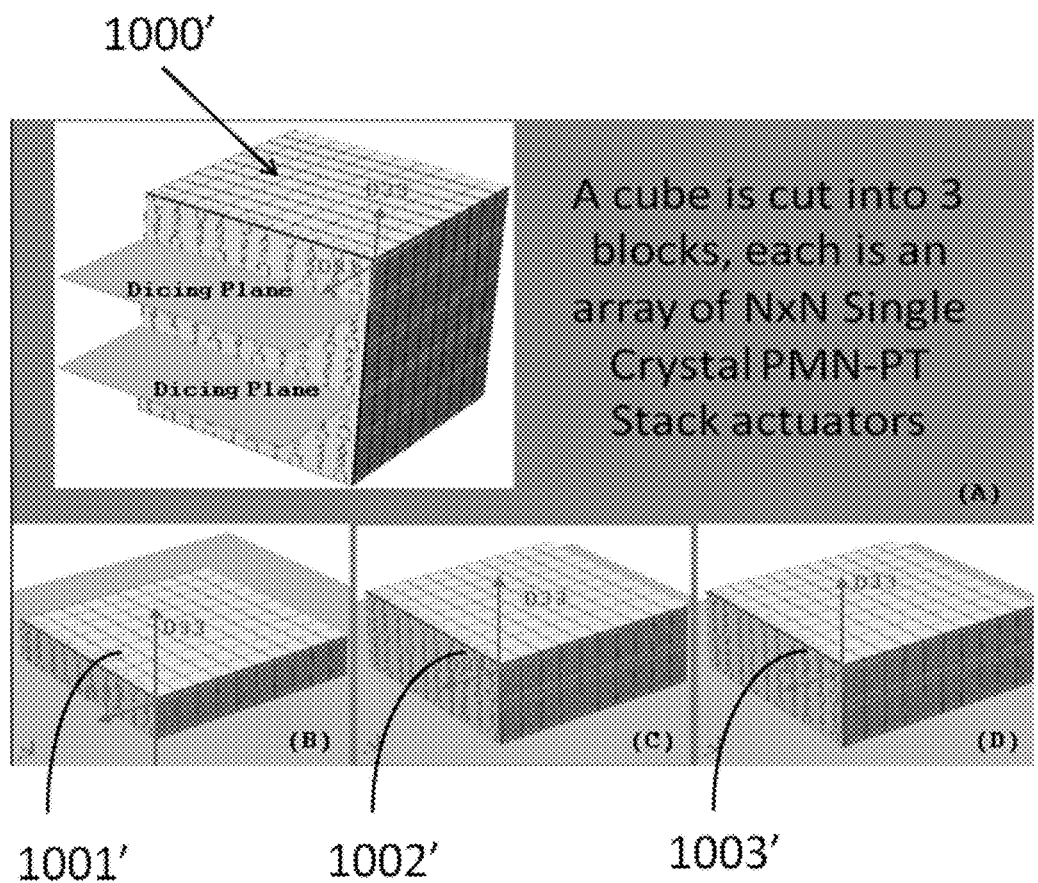
FIG. 4D illustrates a 3-dimensional view of the FIG. 4C pre-structured single crystal PMN-PT cube being further spliced into a few pre-structured PMN-PT cuboids.

In FIG. 4B, two units of the FIG. 4A pre-structured wafers are assembled (e.g. by bonding) together to form a pre-structured cuboid 100' comprising of the two pre-structured PMN-PT wafers. In FIG. 4C, a plurality of the FIG. 4A pre-structured wafers 10' are assembled together to create a pre-structure cube 1000' comprising of the plurality of pre-structured PMN-PT wafers 10' in accordance with the present invention. The pre-structured wafer for the illustration purpose is typically cut form ingot with [001] orientation, thus for this square-shaped wafer, the "d33" mode operation in terms of piezoelectrics is applicable to the three orthogonal directions. All other single crystal wafers orientations other than those shown in FIG. 4C can be used as the starting wafer here in accordance with the present invention. The cube 1000' in FIG. 4C can be then spliced into multiple cuboids 1001', 1002' and 1003' of different stack heights, as shown in FIG. 4D. A larger height for a stack usually can accommodate more stacked thin layers, thus given the same actuation voltage, capable of generating larger stroke.

Note that the pre-structured wafers as described in FIG. 4A-D are not necessarily the same size as that of an original wafer. A larger wafer workpiece, upon completion of process to have become a pre-structured wafer, can be segmented into smaller pre-structured wafers so that they can be used as building blocks for the pre-structured cuboids or cube by following the process procedure.

Figure 5A:
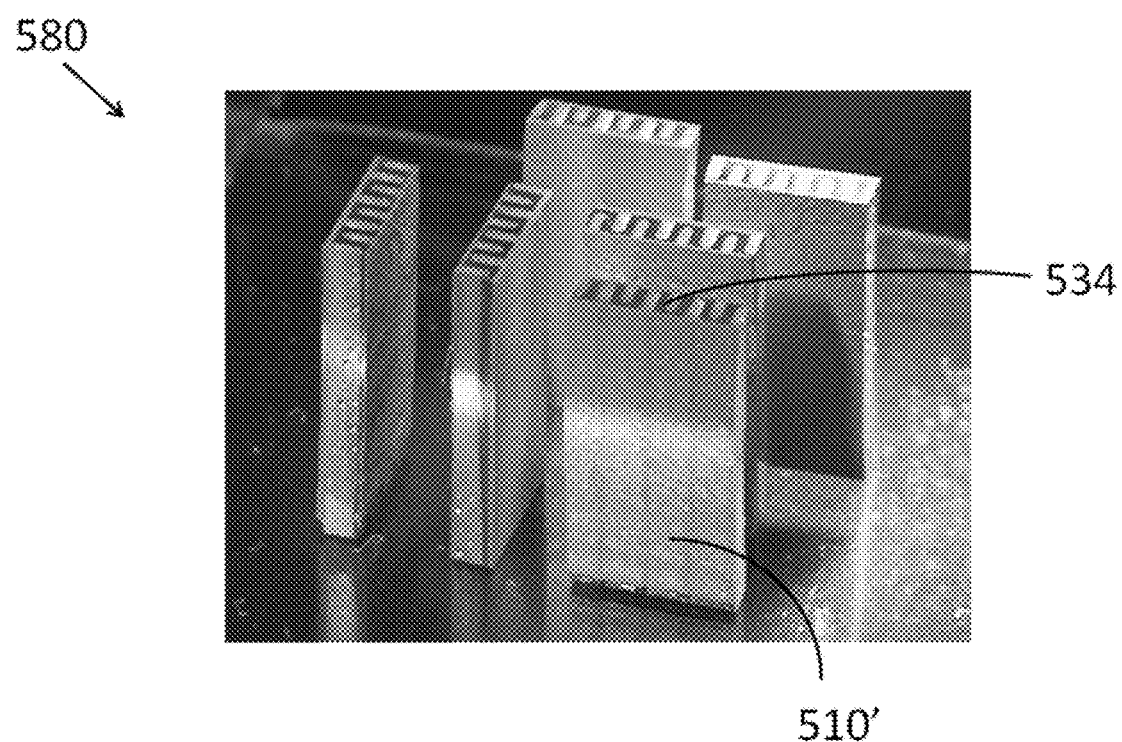
FIG. 5A illustrates a photo of a few pre-structured single crystal PMN-PT wafers, each with a rectangular shape, that have been processed with embedded stack actuators.
Figure 5B:
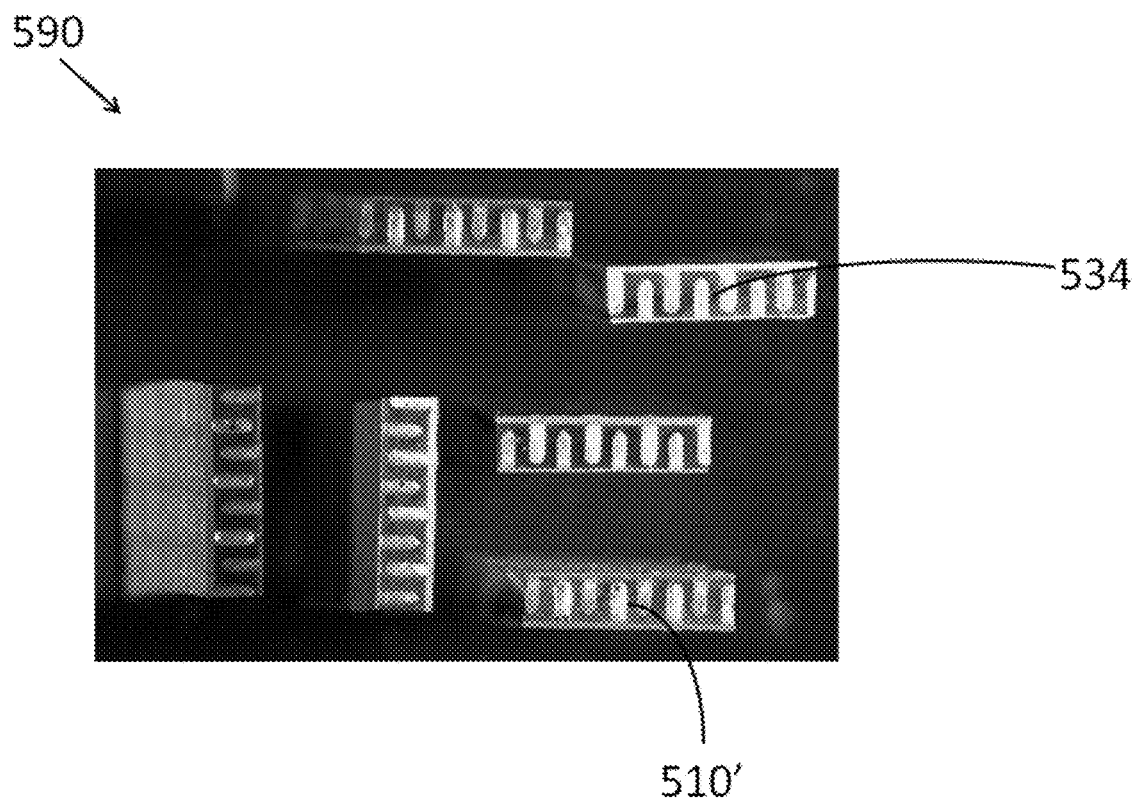
FIG. 5B illustrates a photo of the pre-structured single crystal PMN-PT wafers of FIG. 5A taken from top in order to show the interdigitated multilayers that are produced by using the manufacturing method in accordance with the present invention.
Figure 5C:
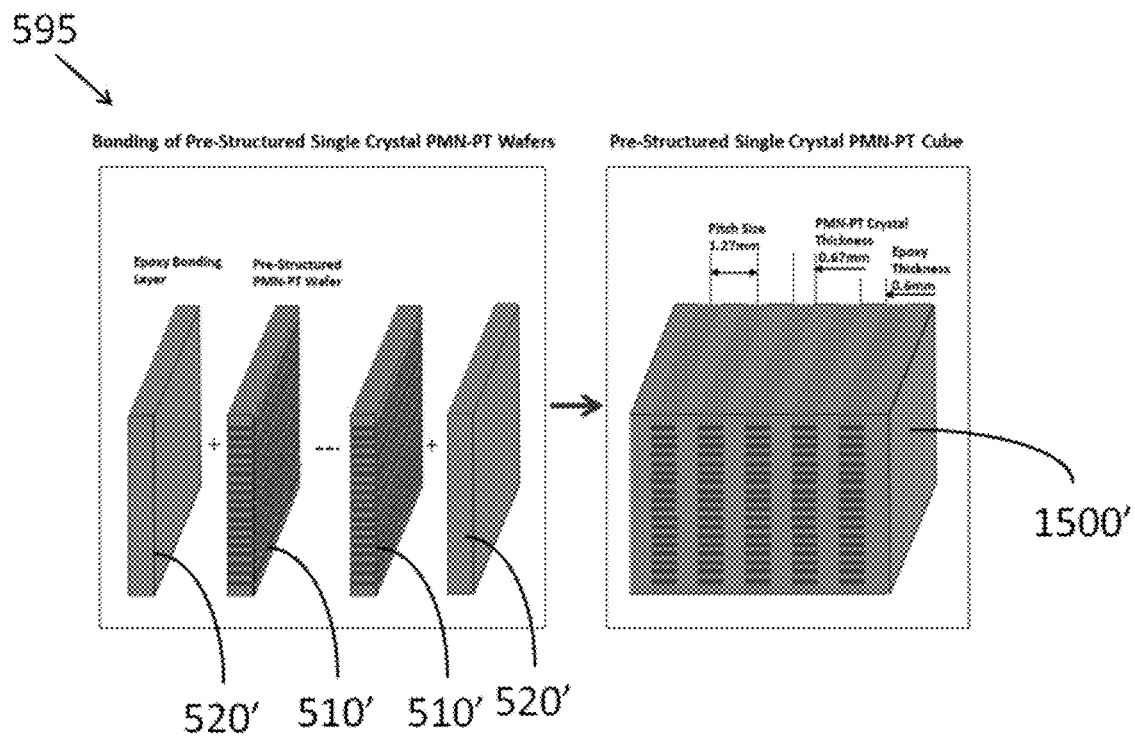
FIG. 5C illustrates an integration and/or assembly process to build a pre-structured single crystal PMN-PT cuboid by using multiple of the pre-structured wafers.
Figure 5D:
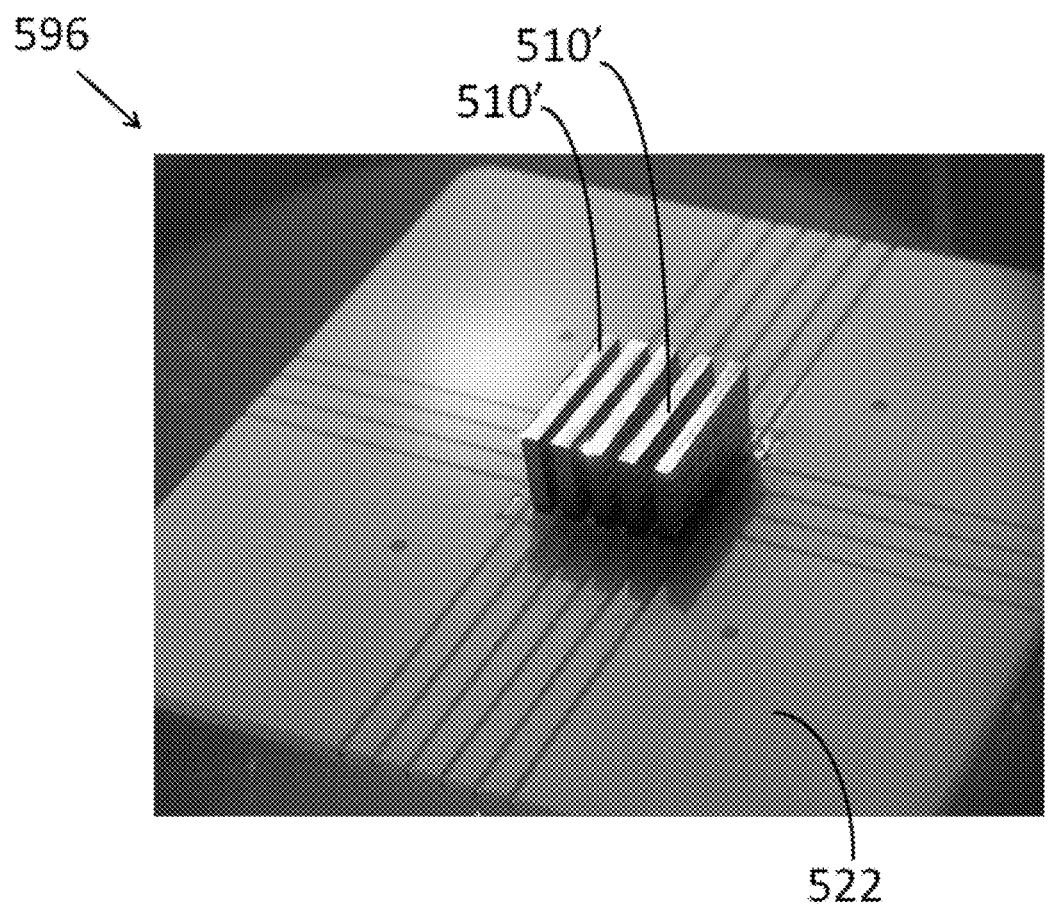
FIG. 5D presents a photo of an assembly comprising of 5 pieces of pre-structured PMN-PT wafers precisely positioned and aligned onto a supporting adaptor plate in order to integrating and or assembling them into a pre-structured single crystal PMN-PT cuboid in accordance with the present invention.
Figure 5E:
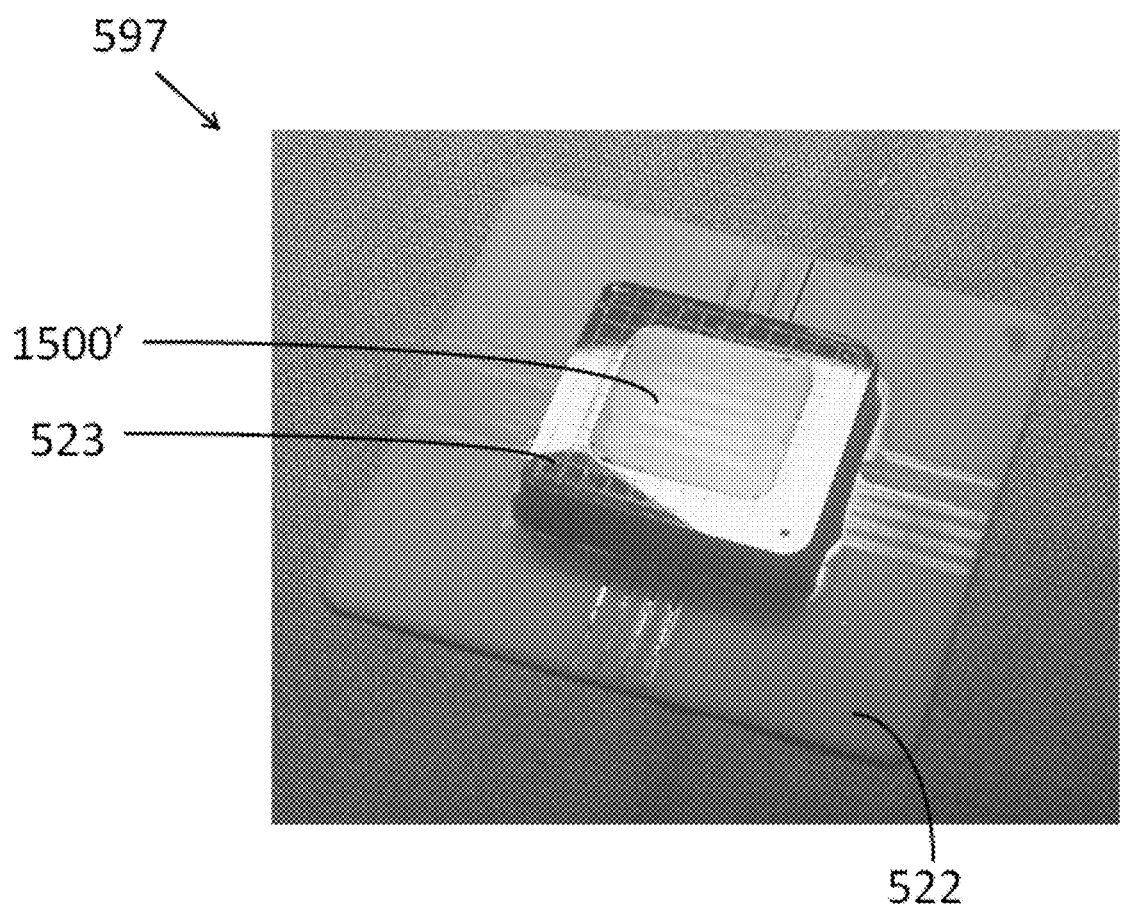
FIG. 5E presents a photo of the FIG. 5D assembly after the 5 pieces of pre-structured PMN-PT wafers have been bonded together into to become a pre-structured single crystal PMN-PT cuboid in accordance with the present invention.

FIG. 5A illustrates a photo 580 of a few pre-structured single crystal PMN-PT wafers 510' of smaller sizes. They are obtained by dicing a larger workpiece, each with a rectangular shape and having been embedded with multi-layer stacks 534. FIG. 5B illustrates another photo of the pre-structured single crystal PMN-PT wafers 510' of FIG. 5A taken from top in order to show the interdigitated multilayers 534 that are produced by using the manufacturing method in accordance with the present invention. FIG. 5C further illustrates an integration and/or assembly process to build a pre-structured single crystal PMN-PT cuboid by using multiple of the pre-structured wafers 510'. In FIG. 5C, a plurality of pre-structured PMN-PT wafers 510' are assembled together by using intermediate layers 520' in between to form a pre-structured PMN-PT cuboid 1500'. FIG. 5D further illustrates a photo 596 for an assembly of five (5) of the pre-structured PMN-PT wafers 510' that are precisely positioned and disposed onto a base supporting substrate 522. The assembly is then form into a solid cuboid 1500', as shown in the photo 597 of FIG. 5E by carrying on an epoxy refilling process that utilizes a ring object 523 as the casting model.

Figure 6A:
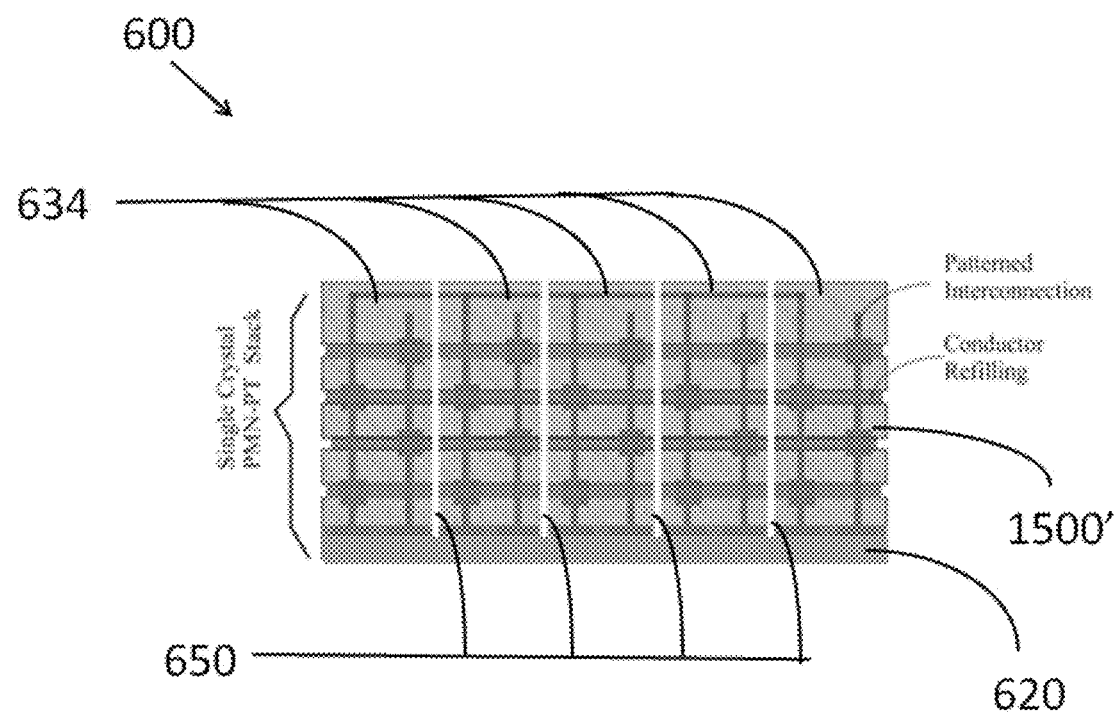
FIG. 6A illustrates a cross-sectional view of a pre-structured single crystal PMN-PT cuboid having been dicing into a stack actuator array in accordance with the present invention.
Figure 6B:
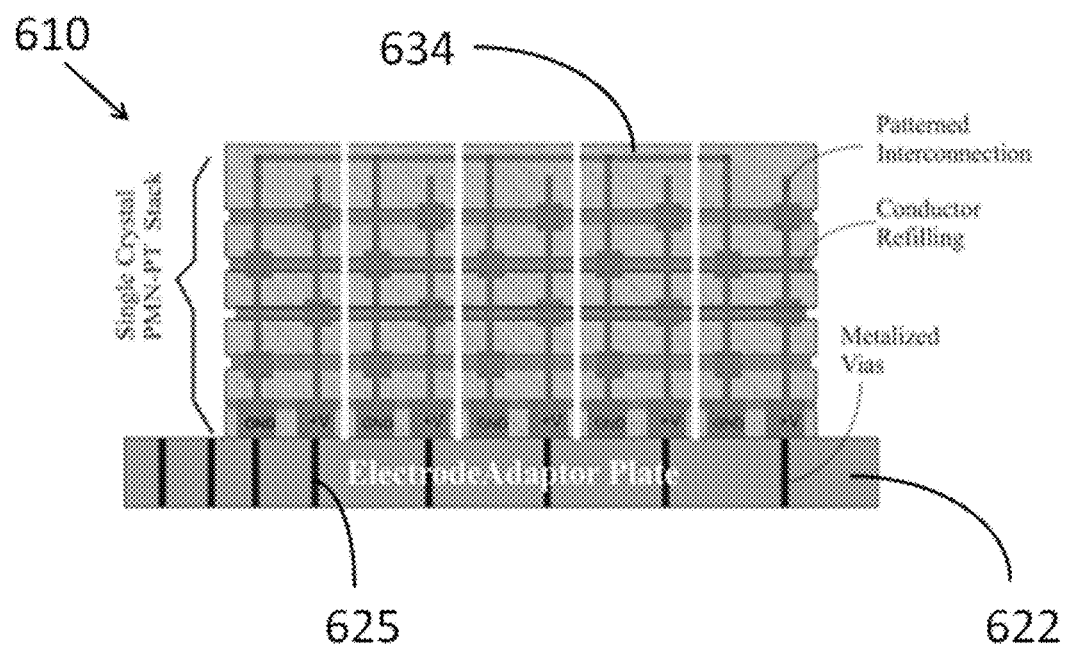
FIG. 6B illustrates another cross-sectional view of a pre-structured single crystal PMN-PT cuboid supported with a base supporting plate and having been dicing into a stack actuator array in accordance with the present invention.
Figure 6C:
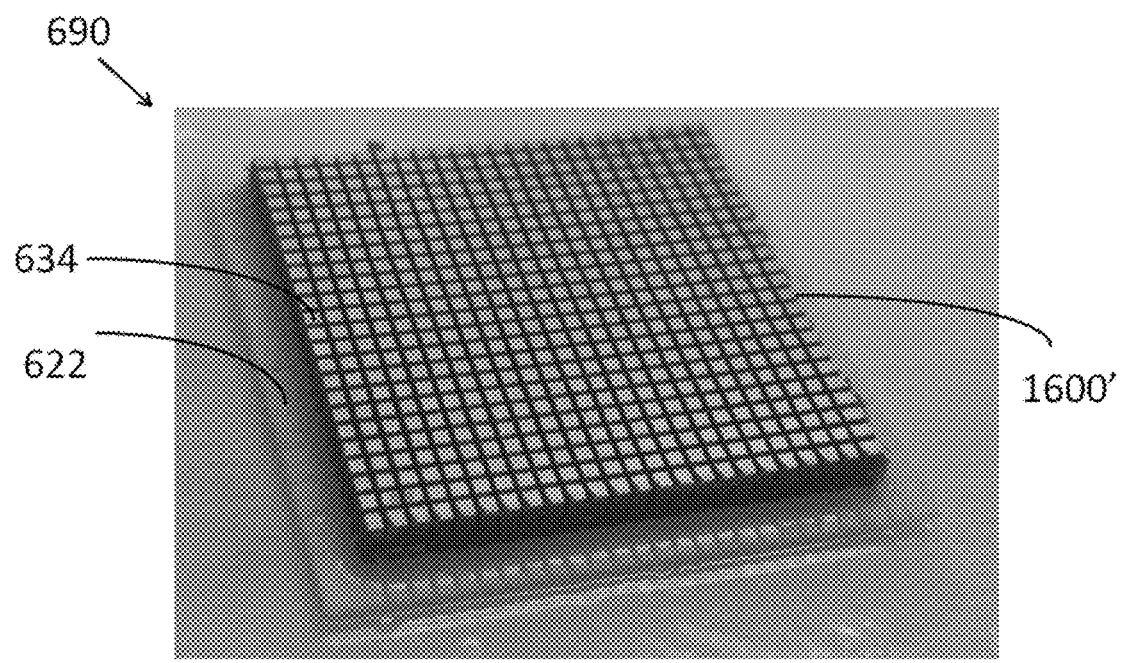
FIG. 6C presents the photo of a pre-structured PMN-PT cuboid that has been segmented into an array of single crystal PMN-PT stack actuators in accordance with the present invention.

Referring now to FIG. 6A, a cross-sectional view 600 of an array of stack actuators 634 that are obtained by segmenting a pre-structured cuboid 1500', is used to illustrate the batch fabrication of multilayer stack actuators in an array format. In FIG. 6A, the pre-structured single crystal PMN-PT cuboid 1500' is diced by following the cut lines 650, and these cut lines or streets, are not through the full-depth (or height, or thickness) of the cuboid 1500', thus a portion 620 remains, capable of providing a mechanical support to keep in place all stack actuators in an array after dicing. If full-depth cutting is desired, a base plate 622 can be attached to the cuboid before carrying on the dicing, as shown in the cross-sectional view 610 of FIG. 6B, where the base plate 622 not only mechanically supports the stack actuator array, but also having via structures 625 in order to allow individual electrodes of stacks 634 to be addressed from the bottom side of the plate 622 in accordance with the present invention. FIG. 6C presents a photo 690 of a 24×24 array of stack actuators 634 that have been obtained by dicing a pre-structured PMN-PT cuboid 1600' in accordance with the present invention.

Figure 7A:
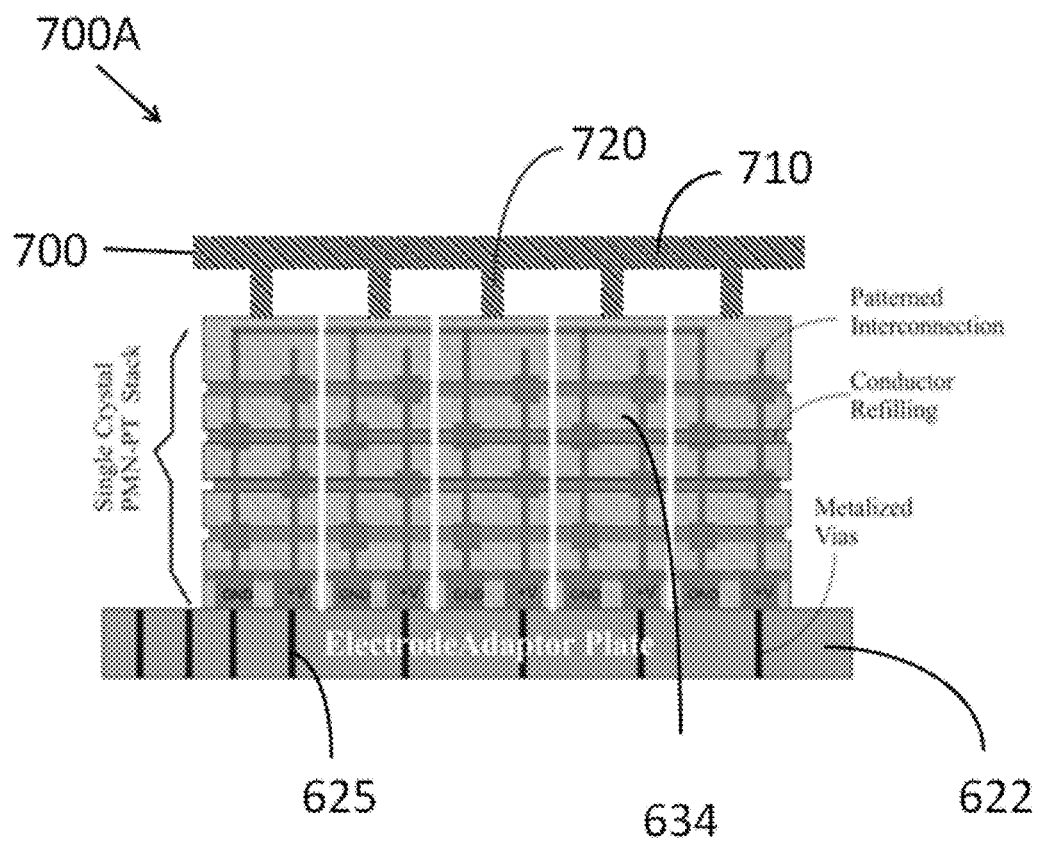
FIG. 7A is the cross-sectional view of an addressable array of stack actuators, supported by a based adaptor plate, and further in integration with a deformable mirror membrane, thus a deformable mirror device equipped with the high performance single crystal piezoelectric stack actuators is ultimately accomplished in accordance with the present invention.

Referring now to FIG. 7A, a cross-sectional view 700A of an addressable array of stack actuators, supported by a based adaptor plate, and further in integration with a deformable mirror membrane 700, thus a deformable mirror device equipped with the high performance single crystal piezoelectric stack actuators is ultimately accomplished in accordance with the present invention, comprising of an addressable array of stack actuators 634 in attachment with a base plate 622, and further in integration with a deformable mirror membrane 710 by using an array of pedestal elements 720.

Figure 7B:
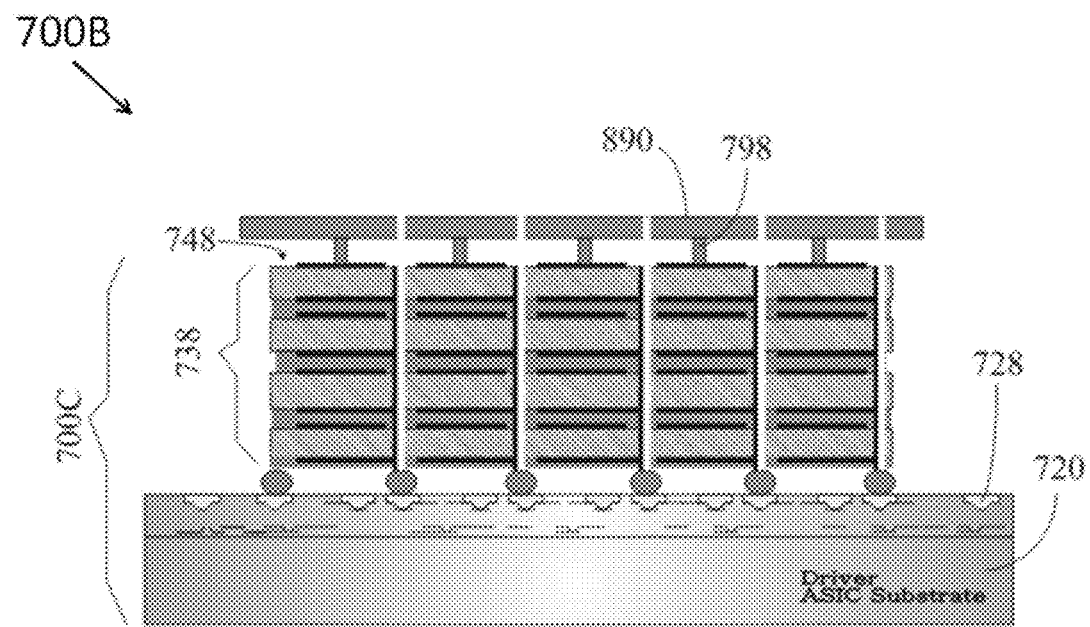
FIG. 7B is the cross-sectional view of an addressable array of stack actuators, supported by a based adaptor plate which in this illustration is a driver ASIC substrate, and further in integration with an array of segmented mirror elements, thus a segmented deformable mirror device equipped with the high performance single crystal piezoelectric stack actuators in accordance with the present invention is ultimately accomplished.

FIG. 7B is the cross-sectional view of a segmented deformable mirror device 700B comprising of an addressable array of stack actuators 738 in integration with a driver ASIC electrode substrate 720, further in integration with an array of segmented mirror elements 890, thus a segmented deformable mirror device 700B equipped with the high performance single crystal piezoelectric stack actuators 748 and in integration of driver ASIC in accordance with the present invention is ultimately accomplished featuring with unprecedented compactness and low mass.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

What is claimed is:

1. A deformable mirror device comprising:
   a base supporting substrate;
   a plurality of stack actuators that is disposed on the base support and that is made by segmenting a pre-structured cuboid or three-dimensional object of a functional material, wherein the pre-structured cuboid or three-dimensional object of a functional material includes a plurality of pre-structured wafers, each having multi-layer stack actuators and with embedded electrodes, and is created by the method comprising: a first step of dicing a functional wafer to form multiple trenches separating multiple thin layers of the functional material; a step of refilling the trenches with electrical conductor to form the said internal electrodes; a step of sequentially repeating the said dicing and refilling process by operating on the said wafer for a suitable number of times in order to produce a pre-structured wafer with embedded stacks, each having a targeted thickness and a targeted number of thin layers of the functional material; a step of integrating, bonding, and/or assembly a plurality of said pre-structured wafer sequentially for a suitable number of times in order to produce the said pre-structured cuboid, a cube, or other three-dimensional object, with a targeted set of dimensions;
   a plurality of pedestals disposed on the plurality of stack actuators;
   a deformable membrane mirror having a reflective surface and a mounting surface mounted in contact with said pedestals; and
   a plurality of addressable electrode contacts and at least one common electrode for providing electrical signals to said electrode contacts to induce a strain in the addressed stack actuators to cause an optical phase modulation on the reflective mirror surface.

2. The deformable mirror device according to claim 1, wherein the plurality of stack actuators, each including a plurality of functional thin layers with a plurality of internal electrodes, is created by the method comprising: a first step of segmenting a functional wafer to form multiple trenches separating multiple thin layers of the functional material; a step of refilling the trenches with electrical conductor to form the said internal electrodes; a step of sequentially repeating the said segmenting and refilling process by operating on the said wafer for a suitable number of times in order to produce stacks having a targeted thickness, and a targeted number of thin layers of the functional material; a step of integrating, bonding, and/or assembling a plurality of said pre-structured wafer sequentially for a suitable number of times in order to produce the said pre-structured wafer stack in the form of cuboid, a cube, or other three-dimensional shapes, with a targeted set of dimensions; and a step of segmenting the cuboid or wafer stack to form the plurality of stack actuators.

3. The method for fabricating the plurality of stack actuators according to claim 2, wherein the said assembling a plurality of said pre-structured wafer sequentially is by wafer bonding technique.

4. The method for fabricating the plurality of stack actuators according to claim 2, wherein the said assembling a plurality of said pre-structured wafer sequentially is by casting technique.

5. The method for fabricating the plurality of stack actuators according to claim 2, wherein the electrode is epoxy-based.

6. The method for fabricating the plurality of stack actuators according to claim 2, wherein the electrode includes deposited metal or alloy.

7. The method for fabricating the plurality of stack actuators according to claim 2, wherein the electrode is electroplated, electroless plated, and/or plated by combination of both techniques.

8. The methods for fabricating the plurality of stack actuators according to claim 2, wherein the electrode is formed from reflowed metal powder or solder paste.

9. The method for fabricating the plurality of stack actuators according to claim 2, wherein said segmenting a substantially thick functional wafer to form multiple trenches is by wafer dicing technique.

10. The method for fabricating the plurality of stack actuators according to claim 2, wherein said segmenting a substantially thick functional wafer to form multiple trenches is by deep reactive ion etching technique.

11. The method for fabricating the plurality of stack actuators according to claim 2, wherein said segmenting a substantially thick functional wafer to form multiple trenches is by ultrasonic assisted etching technique.

12. The method for fabricating the plurality of stack actuators according to claim 2, wherein segmenting a substantially thick functional wafer to form multiple trenches is by water jet technique.

13. The deformable mirror device according to claim 1, wherein the wafer of the functional material is relaxor ferroelectric single crystal material.

14. The deformable mirror device according to claim 1, wherein the wafer of the functional material is PZT based material, either ceramics or single crystal.

15. The deformable mirror device according to claim 1, wherein the wafer of the functional material is electrostrictive material.

16. The deformable mirror device according to claim 1, wherein the wafer of the functional material is magnetostrictive material.

17. The deformable mirror device according to claim 1, wherein the base supporting substrate is non-conductive and has electrode interconnection with the plurality of addressable electrodes of the stack actuators.

18. The deformable mirror device according to claim 1, wherein the base supporting substrate is a driver ASIC (Application Specified Integrated Circuit) substrate that includes semiconductor integrated driver circuits and associating electrodes.

19. The driver ASIC substrate of claim 18 in which the associating electrodes are in interconnection with the plurality of electrode contacts of the array of single crystal piezoelectric stack actuators.

20. The deformable mirror device according to claim 1, wherein the plurality of stack actuators are longitude mode.

21. The deformable mirror device according to claim 1, wherein the plurality of stack actuators are transverse mode.

22. The deformable mirror device according to claim 1, wherein the base supporting substrate is a composite substrate comprising of both an electrode adaptor plate and a driver ASIC (Application Specified Integrated Circuit) substrate, and of which, the electrode adaptor plate is sandwiched between the array of stack actuators and the ASIC substrate.

23. The deformable mirror device according to claim 1, wherein the deformable membrane mirror is a continuous membrane.

24. The deformable mirror device according to claim 1, wherein the deformable membrane mirror is an array of segmented membranes that are substantially rigid.

* * * * *